United States Patent
Choi et al.

(10) Patent No.: US 10,193,539 B1
(45) Date of Patent: Jan. 29, 2019

(54) HIGH SPEED DATA SYNCHRONIZATION

(71) Applicant: SK hynix Inc., Icheon-si Gyeonggi-do (KR)

(72) Inventors: Geun Ho Choi, Icheon-si (KR); Min Su Park, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/855,567

(22) Filed: Dec. 27, 2017

(30) Foreign Application Priority Data

Aug. 21, 2017 (KR) .................. 10-2017-0105271

(51) Int. Cl.
H03K 5/15 (2006.01)
H03K 21/10 (2006.01)

(52) U.S. Cl.
CPC ........... *H03K 5/1508* (2013.01); *H03K 21/10* (2013.01)

(58) Field of Classification Search
CPC .... H03K 5/1506; H03K 5/1508; H03K 21/08; H03K 21/10
USPC ........................................ 327/141, 144, 365
See application file for complete search history.

(56) References Cited

U.S. PATENT DOCUMENTS

| 4,745,302 A * | 5/1988 | Hanawa | H03K 3/356104 |
| | | | 327/160 |
| 2011/0156757 A1 | 6/2011 | Hayashi | |
| 2016/0006596 A1 | 1/2016 | Dickson et al. | |
| 2018/0102151 A1* | 4/2018 | Kim | G11C 7/222 |

FOREIGN PATENT DOCUMENTS

KR        1020150052633 A        5/2015

* cited by examiner

*Primary Examiner* — William Hernandez
(74) *Attorney, Agent, or Firm* — William Park & Associates LTD.

(57) ABSTRACT

According to an embodiment, a semiconductor device may be provided. The semiconductor device may include an internal clock generation circuit configured to generate a plurality of internal clock signals respectively from a plurality of division clock signals. The semiconductor device may include a data input and output (I/O) circuit configured to output input data as output data in synchronization with the plurality of internal clock signals. Each bit of the output data may be outputted in sequential order in synchronization with an internal clock signal from the plurality of internal clock signals.

20 Claims, 12 Drawing Sheets

HIGH SPEED DATA SYNCHRONIZATION

CROSS-REFERENCE TO RELATED APPLICATIONS

The present application claims priority under 35 U.S.C 119(a) to Korean Application No. 10-2017-0105271, filed on Aug. 21, 2017, which is incorporated herein by reference in its entirety.

BACKGROUND

1. Technical Field

Embodiments of the present disclosure generally relate to semiconductor devices suitable for receiving and outputting data in synchronization with an internal clock signal.

2. Related Art

As semiconductor systems are developed to operate at a high speed, high data transmission rates (or data communication at high bandwidth) between semiconductor devices included in each semiconductor system have been increasingly in demand. In response to such a demand, various pre-fetch schemes have been proposed. The pre-fetch scheme may correspond to a design technique that latches data inputted in series and outputs the latched data in parallel. An internal clock divider may be used to obtain the parallel data. If an internal clock signal is divided, a plurality of multi-phase clock signals may be generated and the plurality of multi-phase clock signals may be used in the parallelization or serialization of the data.

SUMMARY

According to an embodiment, a semiconductor device may include an internal clock generation circuit and a data input/output (I/O) circuit. The internal clock generation circuit may be configured to generate first to fourth internal clock signals from first to fourth division clock signals. The data I/O circuit may be configured to output input data as output data in synchronization with the first to fourth internal clock signals. The first internal clock signal may be generated after the fourth internal clock signal is generated, the second internal clock signal may be generated after the first internal clock signal is generated, the third internal clock signal may be generated after the second internal clock signal is generated, and the fourth internal clock signal may be generated after the third internal clock signal is generated.

According to an embodiment, a semiconductor device may include a control circuit, an internal clock generation circuit, and a data input/output (I/O) circuit. The control circuit may be configured to generate first to fourth enablement signals which are set to have an enablement period corresponding to a multiple of a cycle of first to fourth pre-clock signals in response to a pulse signal. The internal clock generation circuit may be configured to generate first to fourth internal clock signals from the first to fourth division clock signals in response to the first to fourth enablement signals. The data I/O circuit may be configured to output input data as output data in synchronization with the first to fourth internal clock signals. The first internal clock signal may be generated during the enablement period of the first enablement signal, the second internal clock signal may be generated during the enablement period of the second enablement signal, the third internal clock signal may be generated during the enablement period of the third enablement signal, and the fourth internal clock signal may be generated during the enablement period of the fourth enablement signal.

According to an embodiment, a semiconductor device may include an internal clock generation circuit configured to generate a plurality of internal clock signals respectively from a plurality of division clock signals. The semiconductor device may include a data input and output (I/O) circuit configured to output input data as output data in synchronization with the plurality of internal clock signals. Each bit of the output data may be outputted in sequential order in synchronization with an internal clock signal from the plurality of internal clock signals. Wherein the output data includes at least four bits. Wherein a number of division clock signals is the same as a number of bits in the output data. Wherein each of the division clock signals are generated by dividing a frequency of a clock signal provided externally from the semiconductor device. Wherein each of the division clock signals are generated to have different phases.

According to an embodiment, a semiconductor device may include a control circuit configured to generate a plurality of enablement signals which are each respectively set to have an enablement period corresponding to a multiple of a cycle of a pre-clock signal from a plurality of pre-clock signals based on a pulse signal. The semiconductor device may include an internal clock generation circuit configured to generate a plurality of internal clock signals respectively from a plurality of division clock signals. The semiconductor device may include a data input and output (I/O) circuit configured to output input data as output data in synchronization with the plurality of internal clock signals. Each bit of the output data may be outputted in sequential order in synchronization with an internal clock signal from the plurality of internal clock signals. Each internal clock signal may be in synchronization with a bit is generated during an enablement period of an enablement signal from the plurality of enablement signals.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

For reference, an embodiment including additional components may be provided. Furthermore, a logic high level or logic low level configuration indicating a state of a signal or circuit may be changed depending on embodiments. Furthermore, the configuration of a transistor required for implementing the same function may be modified. That is, the configuration of the PMOS transistor and the configuration of the NMOS transistor may be replaced with each other, depending on a specific situation. If necessary, various transistors may be applied to implement the configurations.

For reference, an embodiment including additional components may be provided. Furthermore, a logic high or logic low configuration indicating a state of a signal or circuit may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Further, the logic levels of the signals may be different from or the opposite of those described. For example, a signal described as having a logic "high" level may alternatively have a logic "low" level, and a signal described as having a logic "low" level may alternatively have a logic "high" level.

Additionally, in the description of the present disclosure, the terms "first" and "second" may be used to describe various components, but the components are not limited by the terms. The terms may be used to distinguish one component from another component. For example, a first component may be called a second component and a second component may be called a first component without departing from the scope of the present disclosure.

Figure 1:
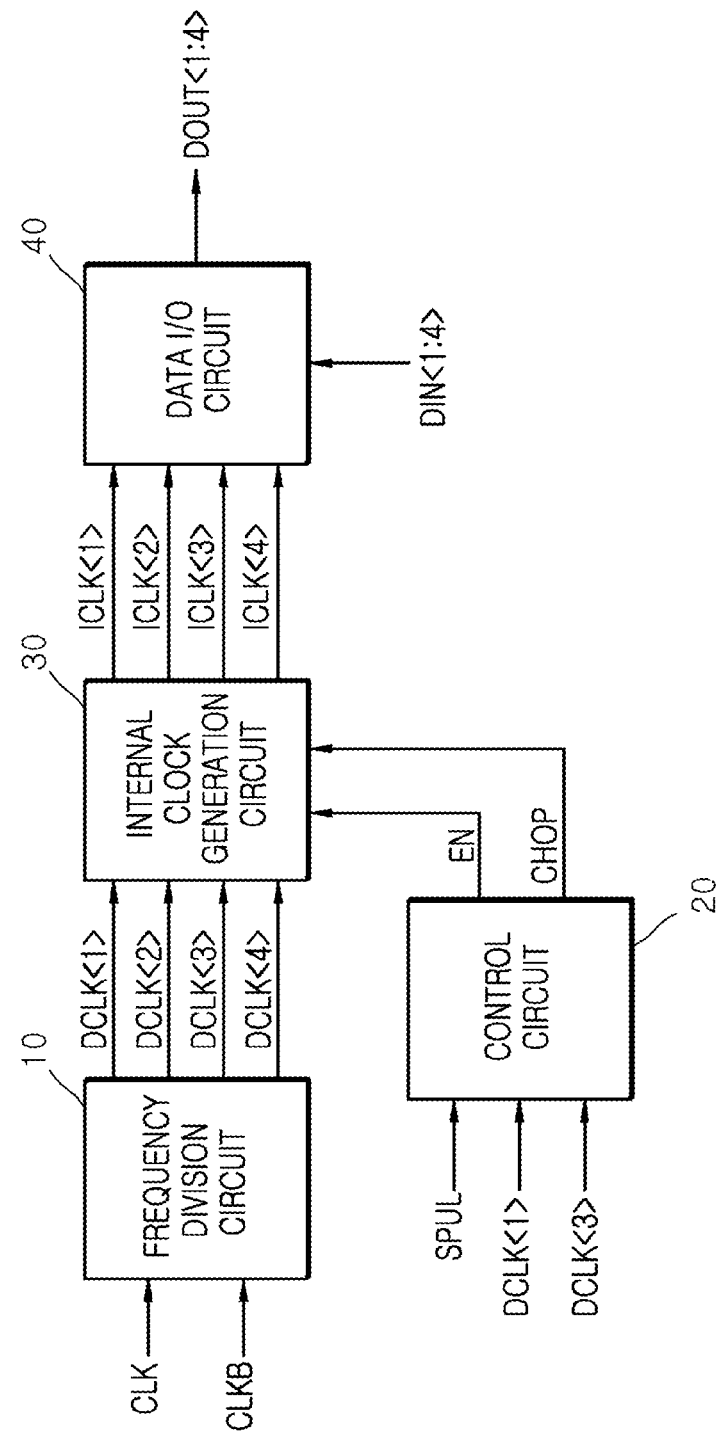
FIG. 1 is a block diagram illustrating a configuration of a semiconductor device according to an embodiment of the present disclosure.

Referring to FIG. 1, a semiconductor device according to an embodiment may include a frequency division circuit 10, a control circuit 20, an internal clock generation circuit 30 and a data input and output (input/output) (I/O) circuit 40.

The frequency division circuit 10 may divide a frequency of a clock signal CLK and a complementary clock signal CLKB, which are provided by an external device, to generate first to fourth division clock signals DCLK<1:4>. The clock signal CLK may be a signal that is periodically toggled. The clock signal CLK may be provided to synchronize an operation of the semiconductor device. The complementary clock signal CLKB may be an inverted signal of the clock signal CLK. The first to fourth division clock signals DCLK<1:4> may be generated by dividing a frequency of the clock signal CLK and the complementary clock signal CLKB to have a phase difference of 90 degrees therebetween. The frequency division circuit 10 may be realized using a general frequency division circuit including a phase locked loop (PLL) circuit and a delay locked loop (DLL) circuit. Although FIG. 1 illustrates an example in which the frequency division circuit 10 generates the first to fourth division clock signals DCLK<1:4> in response to the clock signal CLK, the present disclosure is not limited thereto. For example, the number of the division clock signals generated by the frequency division circuit 10 may be set to be different according to the embodiments.

The control circuit 20 may be synchronized with the first division clock signal DCLK<1> and the third division clock signal DCLK<3> to generate an enablement signal EN and a period signal CHOP which are enabled in response to a pulse signal SPUL. The control circuit 20 may generate the enablement signal EN which is enabled in response to the pulse signal SPUL and which is set to have an enablement period corresponding to a multiple of a cycle of the first division clock signal DCLK<1>. The control circuit 20 may generate the period signal CHOP which is enabled in response to the pulse signal SPUL and which is set to have an enablement period corresponding to a multiple of a cycle of the third division clock signal DCLK<3>. The pulse signal SPUL may be enabled during a write operation for storing first to fourth output data DOUT<1:4> into a memory cell area (not illustrated) and during a read operation for outputting the first to fourth output data DOUT<1:4> stored in the memory cell area.

The internal clock generation circuit 30 may generate first to fourth internal clock signals ICLK<1:4> from the first to fourth division clock signals DCLK<1:4>. The internal clock generation circuit 30 may generate the first internal clock signal ICLK<1> after generation of the fourth internal clock signal ICLK<4>, in response to the enablement signal EN and the period signal CHOP. The internal clock generation circuit 30 may generate the second internal clock signal ICLK<2> after generation of the first internal clock signal ICLK<1>. The internal clock generation circuit 30 may generate the third internal clock signal ICLK<3> after generation of the second internal clock signal ICLK<2>. The internal clock generation circuit 30 may generate the fourth internal clock signal ICLK<4> after generation of the third internal clock signal ICLK<3>. The first internal clock signal ICLK<1> may be generated after the fourth internal clock signal ICLK<4> is generated. The second internal clock signal ICLK<2> may be generated after the first internal clock signal ICLK<1> is generated. The third internal clock signal ICLK<3> may be generated after the second internal clock signal ICLK<2> is generated. The fourth internal clock signal ICLK<4> may be generated after the third internal clock signal ICLK<3> is generated.

The data I/O circuit 40 may be synchronized with the first to fourth internal clock signals ICLK<1:4> to output first to fourth input data DIN<1:4> as the first to fourth output data DOUT<1:4>. The data I/O circuit 40 may align the first to fourth input data DIN<1:4> in synchronization with the first to fourth internal clock signals ICLK<1:4> and may output the aligned first to fourth input data DIN<1:4> as the first to fourth output data DOUT<1:4>. Although the present embodiment illustrates an example in which the number of bits included in the first to fourth output data DOUT<1:4> is four, the number of bits included in the output data may be set to be different according to the embodiments.

Figure 2:
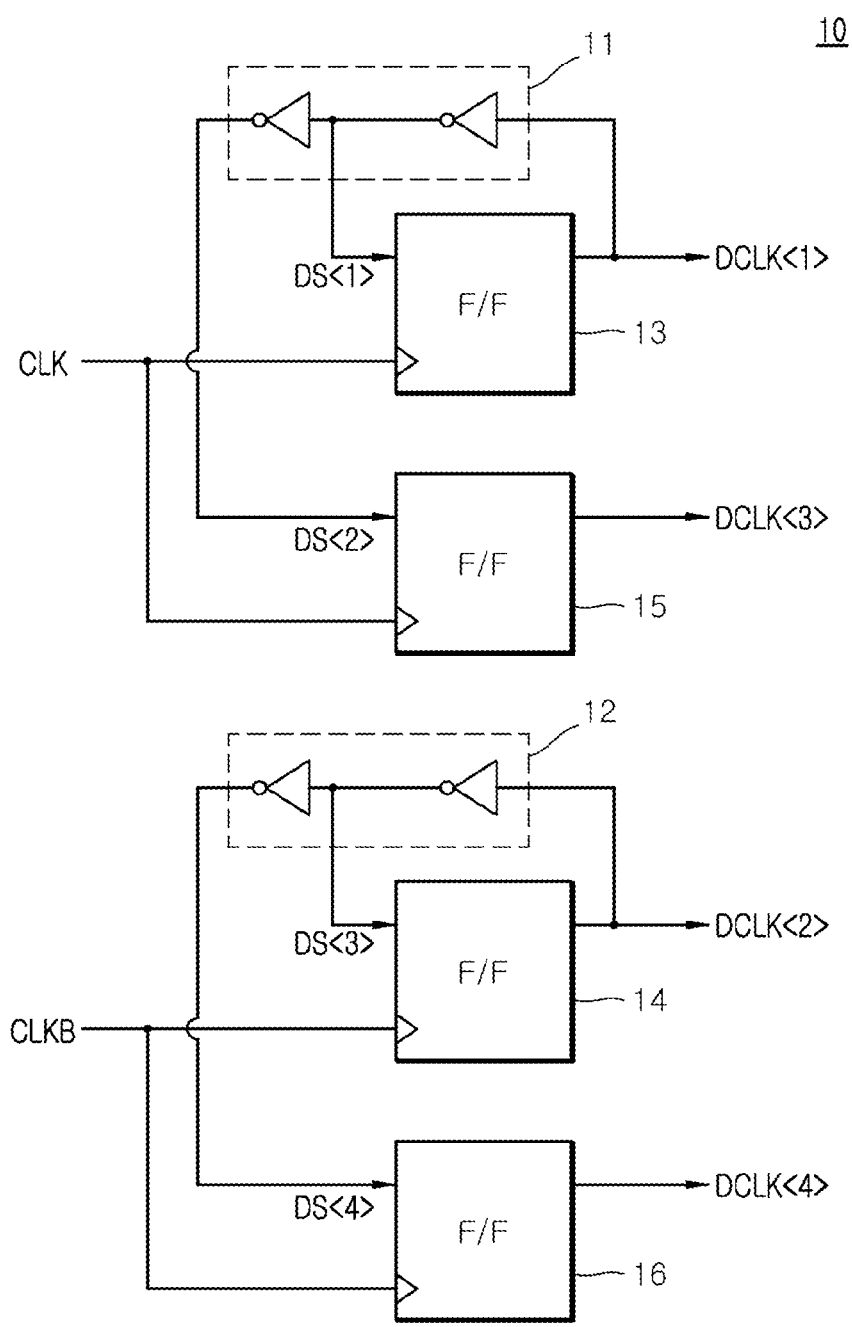
FIG. 2 is a circuit diagram illustrating a configuration of a frequency division circuit included in the semiconductor device of FIG. 1.

Referring to FIG. 2, the frequency division circuit 10 may include a first delay circuit 11, a second delay circuit 12, a first division clock generation circuit 13, a second division clock generation circuit 14, a third division clock generation circuit 15, and a fourth division clock generation circuit 16. In an embodiment, for example, the first to fourth division clock generation circuits may be realized by flip-flops F/F.

The first delay circuit 11 may inversely buffer the first division clock signal DCLK<1> to generate a first delay signal DS<1>. The first delay circuit 11 may inversely buffer the first delay signal DS<1> to generate a second delay signal DS<2>. In an embodiment, for example, the first delay circuit 11 may be configured to perform an inversion and buffering operation on the first division clock signal DCLK<1> to output the first delay signal DS<1>, and then perform another inversion and buffering operation on the first delay signal DS<1> to generate a second delay signal DS<2>. In an embodiment, for example, two or more inverters or equivalent circuit may be included in the first delay circuit.

The second delay circuit 12 may inversely buffer the second division clock signal DCLK<2> to generate a third delay signal DS<3>. The second delay circuit 12 may inversely buffer the third delay signal DS<3> to generate a fourth delay signal DS<4>. In an embodiment, for example, the second delay circuit 12 may be configured to perform an inversion and buffering operation on the second division clock signal DCLK<2> to output the third delay signal DS<3>, and then perform another inversion and buffering operation on the third delay signal DS<3> to generate a fourth delay signal DS<4>. In an embodiment, for example, two or more inverters or equivalent circuit may be included in the second delay circuit.

The first division clock generation circuit 13 may be synchronized with the clock signal CLK to output the first delay signal DS<1> as the first division clock signal DCLK<1>. The first division clock generation circuit 13 may be synchronized with a rising edge of the clock signal CLK to output the first delay signal DS<1> as the first division clock signal DCLK<1>.

The second division clock generation circuit 14 may be synchronized with the complementary clock signal CLKB to output the third delay signal DS<3> as the second division clock signal DCLK<2>. The second division clock generation circuit 14 may be synchronized with a rising edge of the complementary clock signal CLKB to output the third delay signal DS<3> as the second division clock signal DCLK<2>.

The third division clock generation circuit 15 may be synchronized with the clock signal CLK to output the second delay signal DS<2> as the third division clock signal DCLK<3>. The third division clock generation circuit 15 may be synchronized with a rising edge of the clock signal CLK to output the second delay signal DS<2> as the third division clock signal DCLK<3>.

The fourth division clock generation circuit 16 may be synchronized with the complementary clock signal CLKB to output the fourth delay signal DS<4> as the fourth division clock signal DCLK<4>. The fourth division clock generation circuit 16 may be synchronized with a rising edge of the complementary clock signal CLKB to output the fourth delay signal DS<4> as the fourth division clock signal DCLK<4>.

Figure 3:
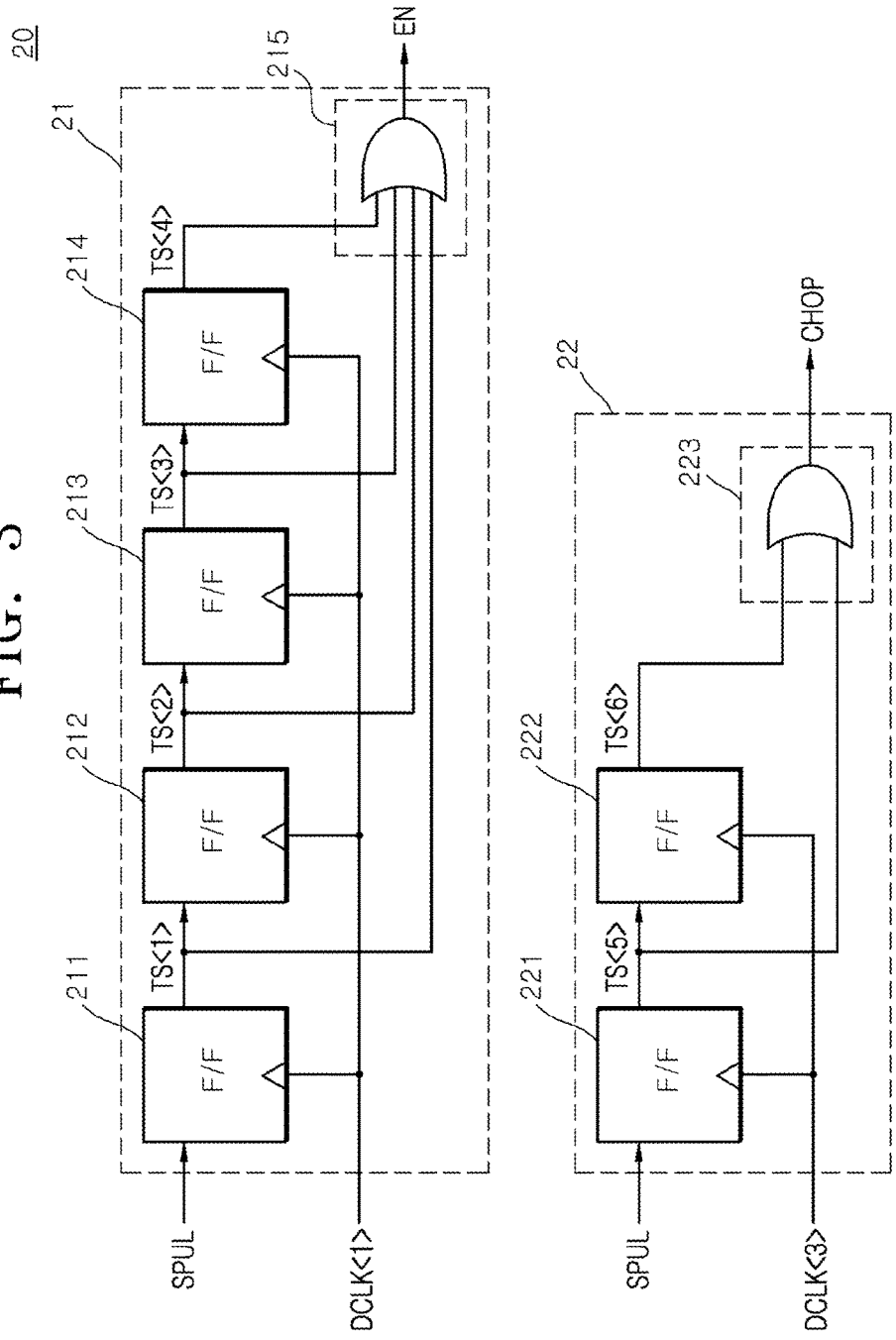
FIG. 3 is a circuit diagram illustrating a configuration of a control circuit included in the semiconductor device of FIG. 1.

Referring to FIG. 3, the control circuit 20 may include an enablement signal generation circuit 21 and a period signal generation circuit 22.

The enablement signal generation circuit 21 may include a first flip-flop 211, a second flip-flop 212, a third flip-flop 213, a fourth flip-flop 214 and a first logic circuit 215.

The first flip-flop 211 may be synchronized with the first division clock signal DCLK<1> to output the pulse signal SPUL as a first transmission signal TS<1>. The first flip-flop 211 may be synchronized with a rising edge of the first division clock signal DCLK<1> to generate the first transmission signal TS<1> having a logic "high" level if the pulse signal SPUL inputted to the first flip-flop 211 has a logic "high" level.

The second flip-flop 212 may be synchronized with the first division clock signal DCLK<1> to output the first transmission signal TS<1> as a second transmission signal TS<2>. The second flip-flop 212 may be synchronized with a rising edge of the first division clock signal DCLK<1> to generate the second transmission signal TS<2> having a logic "high" level if the first transmission signal TS<1> inputted to the second flip-flop 212 has a logic "high" level.

The third flip-flop 213 may be synchronized with the first division clock signal DCLK<1> to output the second transmission signal TS<2> as a third transmission signal TS<3>. The third flip-flop 213 may be synchronized with a rising edge of the first division clock signal DCLK<1> to generate the third transmission signal TS<3> having a logic "high" level if the second transmission signal TS<2> inputted to the third flip-flop 213 has a logic "high" level.

The fourth flip-flop 214 may be synchronized with the first division clock signal DCLK<1> to output the third transmission signal TS<3> as a fourth transmission signal TS<4>. The fourth flip-flop 214 may be synchronized with a rising edge of the first division clock signal DCLK<1> to generate the fourth transmission signal TS<4> having a logic "high" level if the third transmission signal TS<3> inputted to the fourth flip-flop 214 has a logic "high" level.

The first logic circuit 215 may perform a logical OR operation of the first to fourth transmission signals TS<1:4> to generate the enablement signal EN. The first logic circuit 215 may generate the enablement signal EN which is enabled to have a logic "high" level if at least one of the first to fourth transmission signals TS<1:4> is generated to have a logic "high" level. In an embodiment, for example, the first logic circuit 215 may include an OR gate or an equivalent circuit to implement the OR operation.

As described above, the enablement signal generation circuit 21 may generate the enablement signal EN which is enabled in response to the pulse signal SPUL and which is set to have an enablement period corresponding to a multiple of a cycle of the first division clock signal DCLK<1>. The enablement signal generation circuit 21 may generate the enablement signal EN which is enabled to have a logic "high" level if the pulse signal SPUL is inputted and which is disabled to have a logic "low" level if all of the first to fourth transmission signals TS<1:4> are generated to have a logic "low" level. That is, the enablement signal generation circuit 21 may generate the enablement signal EN which is enabled for four cycles of the first division clock signal DCLK<1>.

The period signal generation circuit 22 may include a fifth flip-flop 221, a sixth flip-flop 222 and a second logic circuit 223.

The fifth flip-flop 221 may be synchronized with the third division clock signal DCLK<3> to output the pulse signal SPUL as a fifth transmission signal TS<5>. The fifth flip-flop 221 may be synchronized with a rising edge of the third division clock signal DCLK<3> to generate the fifth transmission signal TS<5> having a logic "high" level if the pulse signal SPUL inputted to the fifth flip-flop 221 has a logic "high" level.

The sixth flip-flop 222 may be synchronized with the third division clock signal DCLK<3> to output the fifth transmission signal TS<5> as a sixth transmission signal TS<6>. The sixth flip-flop 222 may be synchronized with a rising edge of the third division clock signal DCLK<3> to generate the sixth transmission signal TS<6> having a logic "high" level if the fifth transmission signal TS<5> inputted to the sixth flip-flop 222 has a logic "high" level.

The second logic circuit 223 may perform a logical OR operation of the fifth and sixth transmission signals TS<5:6> to generate the period signal CHOP. The second logic circuit 223 may generate the period signal CHOP which is enabled to have a logic "high" level if at least one of the fifth and sixth transmission signals TS<5:6> is generated to have a logic "high" level. In an embodiment, for example, the second logic circuit 223 may include an OR gate or an equivalent circuit to implement the OR operation.

As described above, the period signal generation circuit 22 may generate the period signal CHOP which is enabled in response to the pulse signal SPUL and which is set to have an enablement period corresponding to a multiple of a cycle of the third division clock signal DCLK<3>. The period signal generation circuit 22 may generate the period signal CHOP which is enabled to have a logic "high" level if the pulse signal SPUL is inputted and which is disabled to have a logic "low" level if both of the fifth and sixth transmission signals TS<5:6> are generated to have a logic "low" level. That is, the period signal generation circuit 22 may generate the period signal CHOP which is enabled for two cycles of the third division clock signal DCLK<3>.

Figure 4:
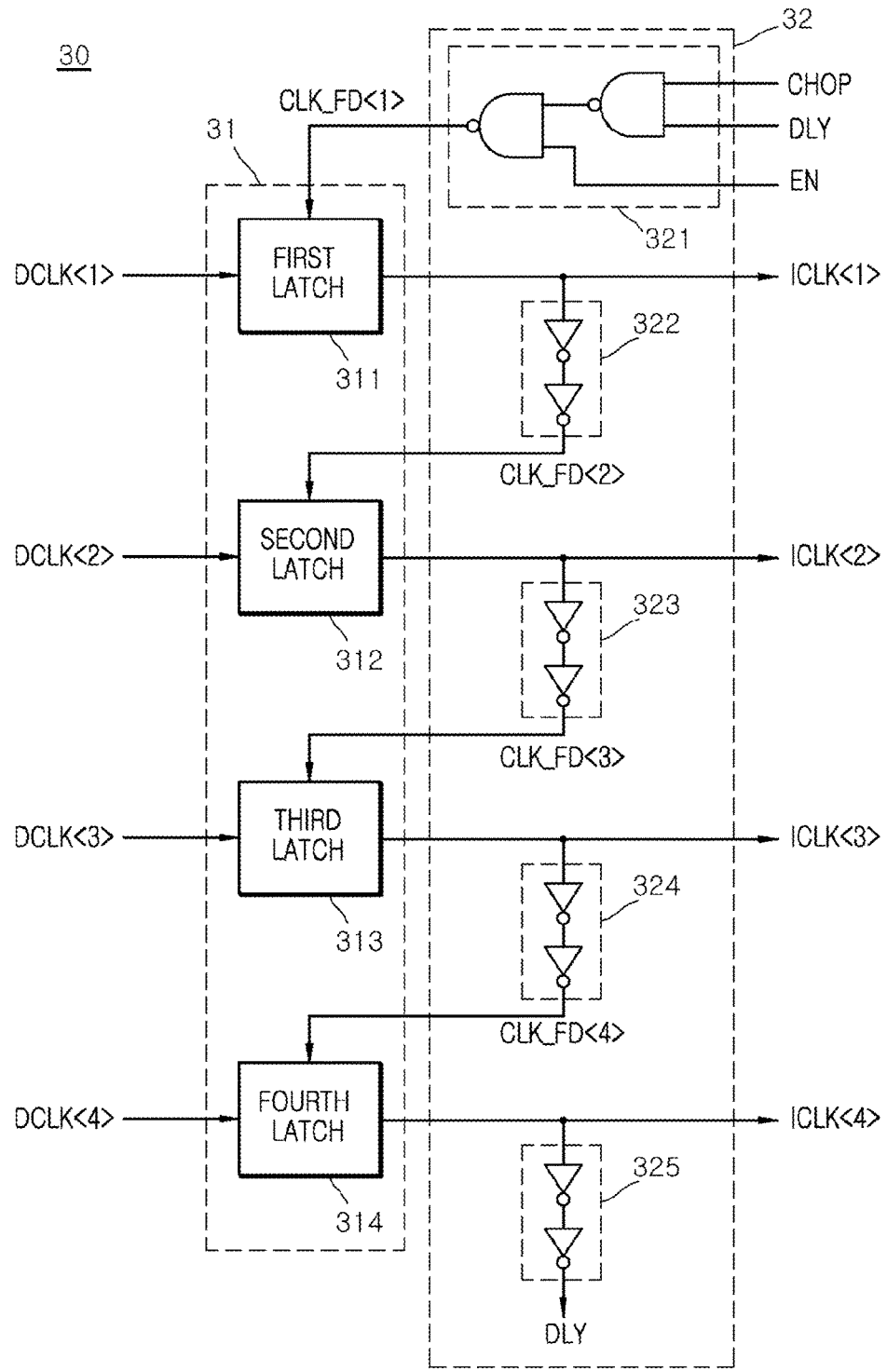
FIG. 4 illustrates a configuration of an internal clock generation circuit included in the semiconductor device of FIG. 1.

Referring to FIG. 4, the internal clock generation circuit 30 may include a latch circuit 31 and a feedback clock generation circuit 32.

The latch circuit 31 may include a first latch 311, a second latch 312, a third latch 313 and a fourth latch 314.

The first latch 311 may latch the first division clock signal DCLK<1> to output the latched first division clock signal DCLK<1> as the first internal clock signal ICLK<1> if a first feedback clock signal CLK_FD<1> has a second logic level (e.g., a logic "high" level). The first latch 311 may interrupt the input of the first division clock signal DCLK<1> if the first feedback clock signal CLK_FD<1> has a first logic level (e.g., a logic "low" level). The first latch 311 may output the first internal clock signal ICLK<1> having the first logic level (e.g., a logic "low" level) if the first division clock signal DCLK<1> has the first logic level (e.g., a logic "low" level).

The second latch 312 may latch the second division clock signal DCLK<2> to output the latched second division clock signal DCLK<2> as the second internal clock signal ICLK<2> if a second feedback clock signal CLK_FD<2> has the second logic level (e.g., a logic "high" level). The second latch 312 may interrupt the input of the second division clock signal DCLK<2> if the second feedback clock signal CLK_FD<2> has the first logic level (e.g., a logic "low" level). The second latch 312 may output the second internal clock signal ICLK<2> having the first logic level (e.g., a logic "low" level) if the second division clock signal DCLK<2> has the first logic level (e.g., a logic "low" level).

The third latch 313 may latch the third division clock signal DCLK<3> to output the latched third division clock signal DCLK<3> as the third internal clock signal ICLK<3> if a third feedback clock signal CLK_FD<3> has the second logic level (e.g., a logic "high" level). The third latch 313 may interrupt the input of the third division clock signal DCLK<3> if the third feedback clock signal CLK_FD<3> has the first logic level (e.g., a logic "low" level). The third latch 313 may output the third internal clock signal ICLK<3> having the first logic level (e.g., a logic "low" level) if the third division clock signal DCLK<3> has the first logic level (e.g., a logic "low" level).

The fourth latch 314 may latch the fourth division clock signal DCLK<4> to output the latched fourth division clock signal DCLK<4> as the fourth internal clock signal ICLK<4> if a fourth feedback clock signal CLK_FD<4> has the second logic level (e.g., a logic "high" level). The fourth latch 314 may interrupt the input of the fourth division clock signal DCLK<4> if the fourth feedback clock signal CLK_FD<4> has the first logic level (e.g., a logic "low" level). The fourth latch 314 may output the fourth internal clock signal ICLK<4> having the first logic level (e.g., a logic "low" level) if the fourth division clock signal DCLK<4> has the first logic level (e.g., a logic "low" level).

The feedback clock generation circuit 32 may include a third logic circuit 321, a third delay circuit 322, a fourth delay circuit 323, a fifth delay circuit 324 and a sixth delay circuit 325.

The third logic circuit 321 may delay a delay signal DLY to output the delayed delay signal DLY as the first feedback clock signal CLK_FD<1>, in response to the enablement signal EN and the period signal CHOP. The third logic circuit 321 may delay the delay signal DLY to output the delayed delay signal DLY as the first feedback clock signal CLK_FD<1>, if the enablement signal EN is enabled to have a logic "high" level and the period signal CHOP has a logic "high" level. For example, in an embodiment, the third logic circuit 321 may perform a NAND operation with the period signal CHOP and the delay signal DLY to produce a resultant signal. The third logic circuit 321 may then perform a NAND operation with the resultant signal and the enablement signal EN to output the delayed delay signal DLY as the first feedback clock signal CLK_FD<1>. In an embodiment, for example, one or more NAND gates may be included in the third logic circuit.

The third delay circuit 322 may delay the first internal clock signal ICLK<1> to output the delayed first internal clock signal ICLK<1> as the second feedback clock signal CLK_FD<2>. The third delay circuit 322 may buffer the first internal clock signal ICLK<1> to output the buffered first internal clock signal ICLK<1> as the second feedback clock signal CLK_FD<2>. In an embodiment, for example, the third delay circuit 322 may be configured to perform an inversion operation on the first internal clock signal ICLK<1> and output a resultant signal. Then the third day circuit 322 may be configured to perform another inversion operation on the resultant signal to output the second feedback clock signal CLK_FD<2>. In an embodiment, for example, inverters or an equivalent circuit may be used to delay the first internal clock signal ICLK<1> to output the second feedback clock signal CLK_FD<2>.

The fourth delay circuit 323 may delay the second internal clock signal ICLK<2> to output the delayed second internal clock signal ICLK<2> as the third feedback clock signal CLK_FD<3>. The fourth delay circuit 323 may buffer the second internal clock signal ICLK<2> to output the buffered second internal clock signal ICLK<2> as the third feedback clock signal CLK_FD<3>. In an embodiment, for example, the fourth delay circuit 323 may be configured to perform an inversion operation on the second internal clock signal ICLK<2> and output a resultant signal. Then the fourth day circuit 323 may be configured to perform another inversion operation on the resultant signal to output the third feedback clock signal CLK_FD<3>. In an embodiment, for example, inverters or an equivalent circuit may be used to delay the second internal clock signal ICLK<2> to output the third feedback clock signal CLK_FD<3>.

The fifth delay circuit 324 may delay the third internal clock signal ICLK<3> to output the delayed third internal clock signal ICLK<3> as the fourth feedback clock signal CLK_FD<4>. The fifth delay circuit 324 may buffer the third internal clock signal ICLK<3> to output the buffered third internal clock signal ICLK<3> as the fourth feedback clock signal CLK_FD<4>. In an embodiment, for example, the fifth delay circuit 324 may be configured to perform an inversion operation on the third internal clock signal ICLK<3> and output a resultant signal. Then the fifth day circuit 324 may be configured to perform another inversion operation on the resultant signal to output the fourth feedback clock signal CLK_FD<4>. In an embodiment, for example, inverters or an equivalent circuit may be used to delay the third internal clock signal ICLK<3> to output the fourth feedback clock signal CLK_FD<4>.

The sixth delay circuit 325 may delay the fourth internal clock signal ICLK<4> to output the delayed fourth internal clock signal ICLK<4> as the delay signal DLY. The sixth delay circuit 325 may buffer the fourth internal clock signal ICLK<4> to output the buffered fourth internal clock signal ICLK<4> as the delay signal DLY.

Figure 5:
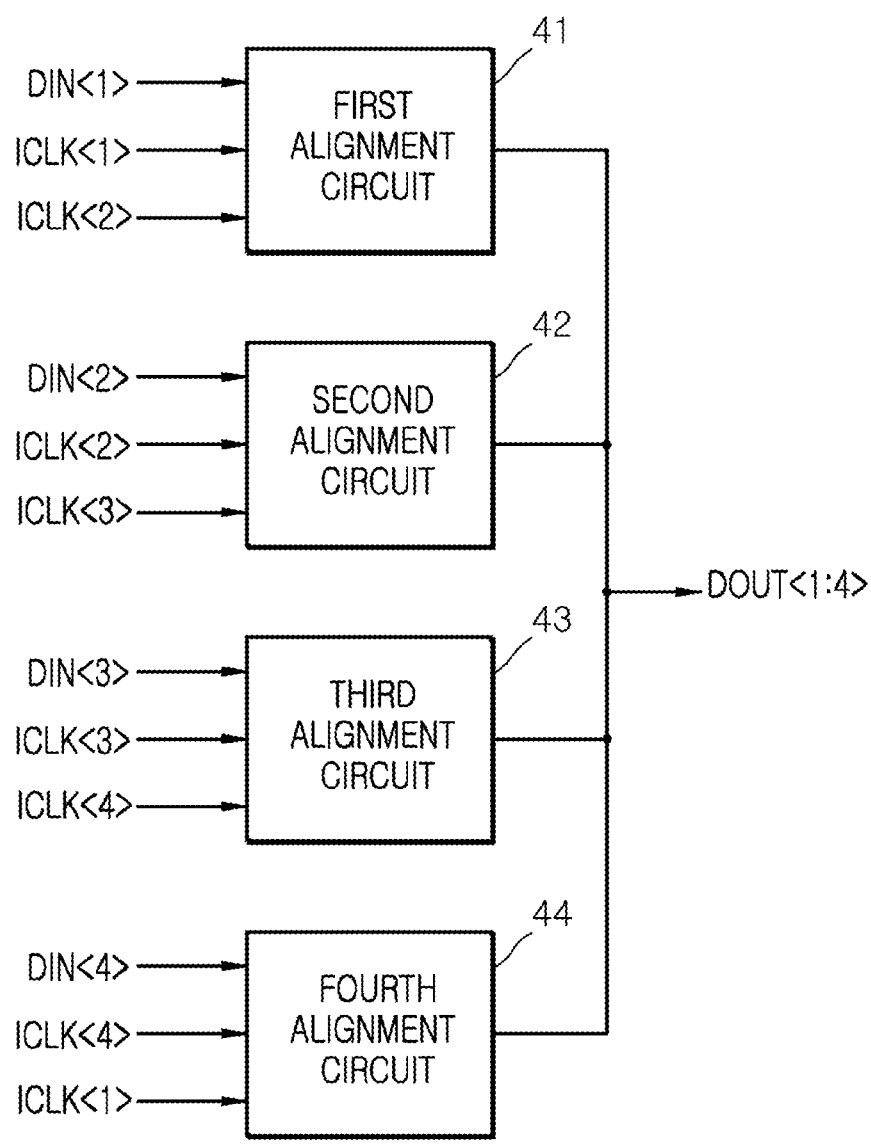
FIG. 5 is a block diagram illustrating a configuration of a data input/output (I/O) circuit included in the semiconductor device of FIG. 1.

Referring to FIG. 5, the data I/O circuit 40 may include a first alignment circuit 41, a second alignment circuit 42, a third alignment circuit 43 and a fourth alignment circuit 44.

The first alignment circuit 41 may perform a pre-charge operation if at least one of the first and second internal clock signals ICLK<1:2> is not generated. The first alignment circuit 41 may drive the first output datum DOUT<1> in response to the first input datum DIN<1> if the first and second internal clock signals ICLK<1:2> are generated.

The second alignment circuit 42 may perform the pre-charge operation if at least one of the second and third internal clock signals ICLK<2:3> is not generated. The second alignment circuit 42 may drive the second output datum DOUT<2> in response to the second input datum DIN<2> if the second and third internal clock signals ICLK<2:3> are generated.

The third alignment circuit 43 may perform the pre-charge operation if at least one of the third and fourth internal clock signals ICLK<3:4> is not generated. The third alignment circuit 43 may drive the third output datum DOUT<3> in response to the third input datum DIN<3> if the third and fourth internal clock signals ICLK<3:4> are generated.

The fourth alignment circuit 44 may perform the pre-charge operation if at least one of the first and fourth internal clock signals ICLK<1> and ICLK<4> is not generated. The fourth alignment circuit 44 may drive the fourth output datum DOUT<4> in response to the fourth input datum DIN<4> if the first and fourth internal clock signals ICLK<1> and ICLK<4> are generated.

Figure 6:
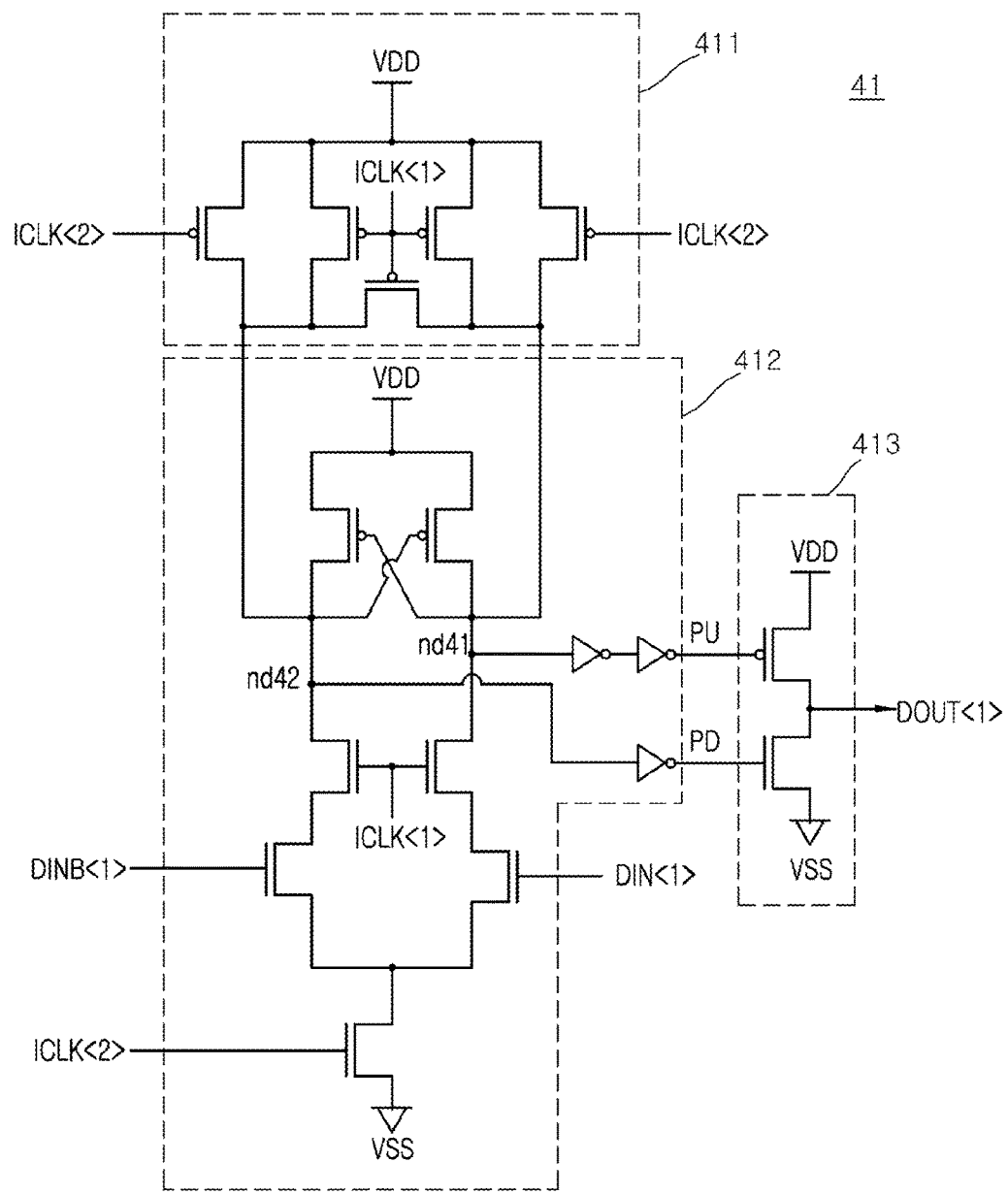
FIG. 6 is a circuit diagram illustrating a configuration of a first alignment circuit included in the data input/output (I/O) circuit of FIG. 5.

Referring to FIG. 6, the first alignment circuit 41 may include a pre-charge circuit 411, a pull-up and pull-down (pull-up/pull-down) signal generation circuit 412 and a driving circuit 413.

The pre-charge circuit 411 may drive a first internal node nd41 and a second internal node nd42 to a level of a power supply voltage VDD if at least one of the first and second internal clock signals ICLK<1> and ICLK<2> is not generated. That at least one of the first and second internal clock signals ICLK<1> and ICLK<2> is not generated may mean a time period that at least one of the first and second internal clock signals ICLK<1> and ICLK<2> has a voltage level which is lower than a reference level between a ground voltage VSS and the power supply voltage VDD. The time period that at least one of the first and second internal clock signals ICLK<1> and ICLK<2> is not generated will be described more fully with reference to FIG. 7 later.

The pull-up/pull-down signal generation circuit 412 may generate a pull-up signal PU and a pull-down signal PD in response to the first input datum DIN<1> and a first complementary input datum DINB<1> if both of the first and second internal clock signals ICLK<1> and ICLK<2> are generated. The pull-up/pull-down signal generation circuit 412 may pull down the first internal node nd41 to a level of the ground voltage VSS to generate the pull-up signal PU having a logic "low" level and the pull-down signal PD having a logic "low" level, if both of the first and second internal clock signals ICLK<1> and ICLK<2> are generated, the first input datum DIN<1> has a logic "high" level, and the first complementary input datum DINB<1> has a logic "low" level. The pull-up/pull-down signal generation circuit 412 may pull down the second internal node nd42 to a level of the ground voltage VSS to generate the pull-up signal PU having a logic "high" level and the pull-down signal PD having a logic "high" level, if both of the first and second internal clock signals ICLK<1> and ICLK<2> are generated, the first input datum DIN<1> has a logic "low" level, and the first complementary input datum DINB<1> has a logic "high" level. The first complementary input datum DINB<1> may be set to be an inverted signal of the first input datum DIN<1>. That both of the first and second internal clock signals ICLK<1> and ICLK<2> are generated may mean a time period that both of the first and second internal clock signals ICLK<1> and ICLK<2> have a voltage level which is higher than a reference level between the ground voltage VSS and the power supply voltage VDD. The time period that both of the first and second internal clock signals ICLK<1> and ICLK<2> are generated will be described more fully with reference to FIG. 7 later.

The driving circuit 413 may drive the first output datum DOUT<1> in response to the pull-up signal PU and the pull-down signal PD. The driving circuit 413 may drive the first output datum DOUT<1> to a logic "high" level if the pull-up signal PU has a logic "low" level and the pull-down signal PD has a logic "low" level. The driving circuit 413 may drive the first output datum DOUT<1> to a logic "low" level if the pull-up signal PU has a logic "high" level and the pull-down signal PD has a logic "high" level.

Each of the second to fourth alignment circuits 42, 43 and 44 may be realized using the same circuit as the first alignment circuit 41 illustrated in FIG. 6 except input and output signals thereof. Thus, detailed descriptions of the second to fourth alignment circuits 42, 43 and 44 will be omitted hereinafter.

Figure 7:
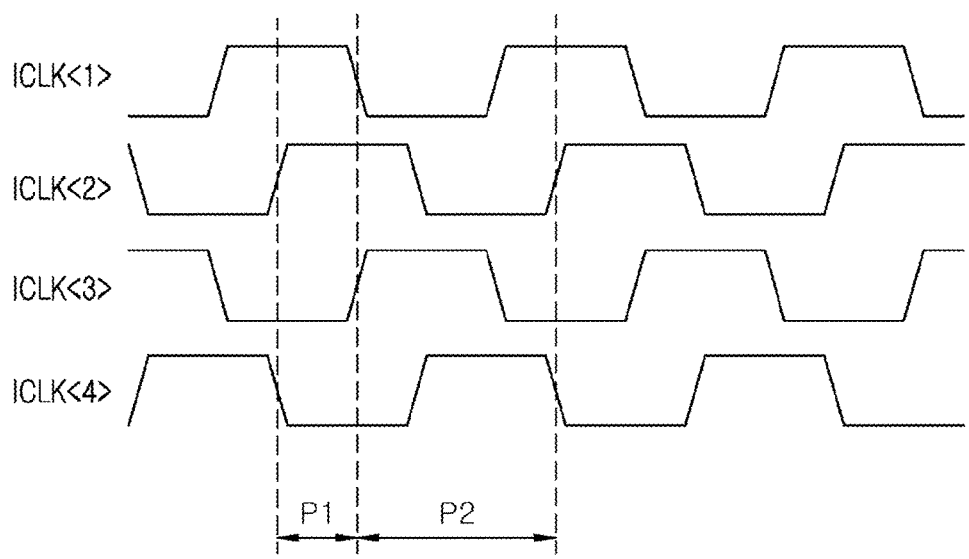
FIG. 7 is a timing diagram illustrating an operation of the first alignment circuit illustrated in FIG. 6.

An operation of the first alignment circuit 41 for driving the first output datum DOUT<1> with the pre-charge operation will be described hereinafter with reference to FIG. 7.

A first period P1 may mean a time period that the first internal clock signal ICLK<1> is generated to have a logic "high" level. In addition, the first period P1 may mean a time period that the second internal clock signal ICLK<2> is generated to have a logic "high" level. In such a case, the logic "high" level means a voltage level which is higher than a reference voltage between the ground voltage VSS and the power supply voltage VDD.

During the first period P1, the first alignment circuit 41 may be synchronized with the first and second internal clock signals ICLK<1> and ICLK<2> having a logic "high" level to drive the first output datum DOUT<1> in response to the first input datum DIN<1>.

A second period P2 may mean a time period that at least one of the first and second internal clock signals ICLK<1> and ICLK<2> is generated to have a logic "low" level. That is, the second period P2 may correspond to a time period that at least one of the first and second internal clock signals ICLK<1> and ICLK<2> is not generated. In such a case, the logic "low" level means a voltage level which is lower than a reference voltage between the ground voltage VSS and the power supply voltage VDD.

The first alignment circuit 41 may perform the pre-charge operation for driving the first and second internal nodes nd41 and nd42 of FIG. 6 to a level of the power supply voltage VDD if at least one of the first and second internal clock signals ICLK<1> and ICLK<2> is not generated.

Figure 8:
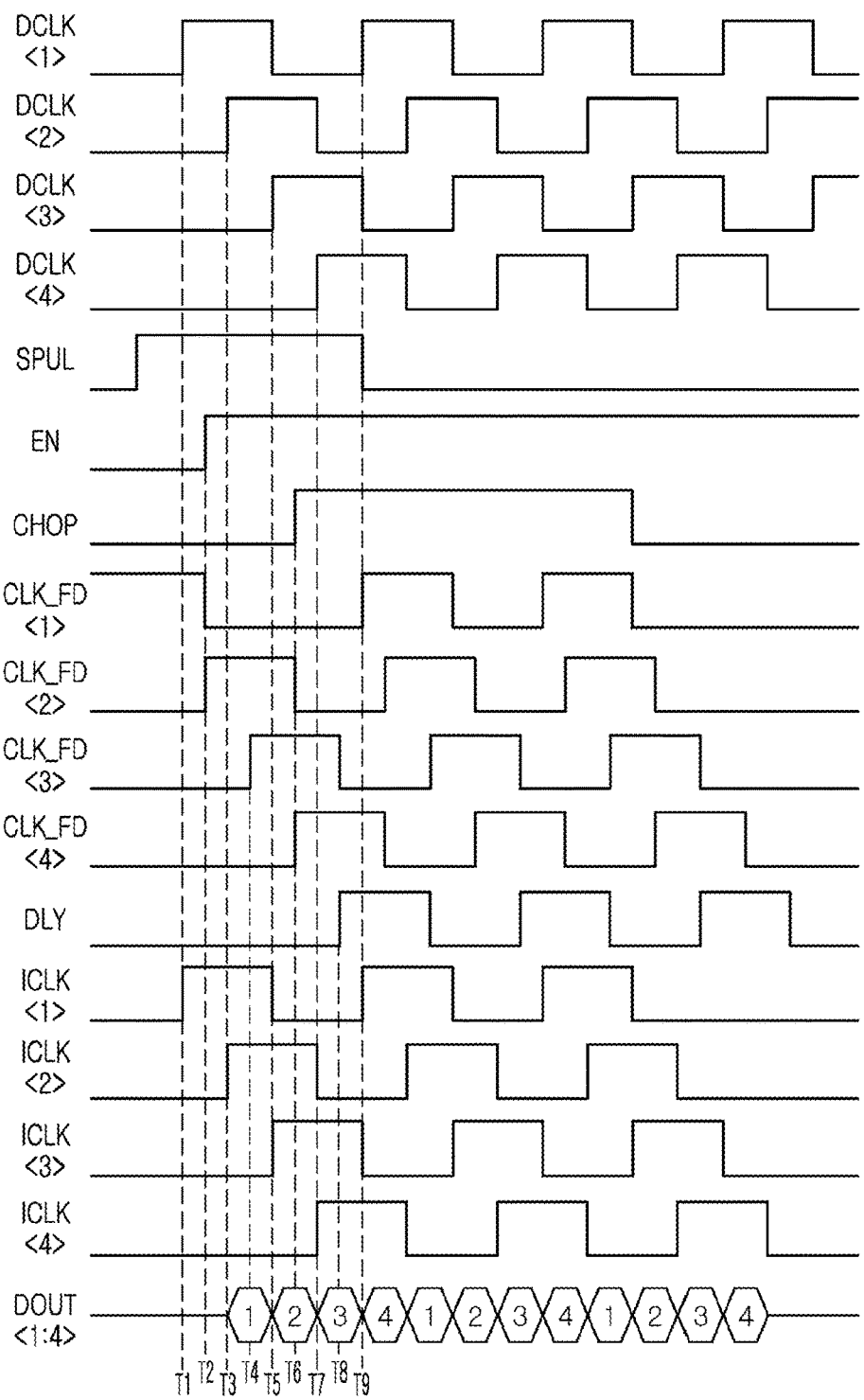
FIG. 8 is a timing diagram illustrating an operation of a semiconductor device according to an embodiment of the present disclosure.

An operation of the semiconductor device having an aforementioned configuration will be described hereinafter with reference to FIG. 8. In particular, an operation of the semiconductor device for outputting the first to fourth input data DIN<1:4> as the first to fourth output data DOUT<1:4> in synchronization with the first to fourth internal clock signals ICLK<1:4> will be described hereinafter.

At a point of time "T1", the frequency division circuit 10 may divide a frequency of the clock signal CLK and the complementary clock signal CLKB, which are provided by an external device, to generate the first division clock signal DCLK<1>.

The third logic circuit 321 of the feedback clock generation circuit 32 may generate the first feedback clock signal CLK_FD<1> having a logic "high" level in response to the enablement signal EN having a logic "low" level.

The first latch 311 of the latch circuit 31 may latch the first division clock signal DCLK<1> in response to the first feedback clock signal CLK_FD<1> having a logic "high" level and may output the latched first division clock signal DCLK<1> as the first internal clock signal ICLK<1>.

At a point of time "T2", the enablement signal generation circuit 21 may generate the enablement signal EN which is enabled to have a logic "high" level in response to the pulse signal SPUL. The enablement signal EN may be set to have an enablement period corresponding to four cycles of the first division clock signal DCLK<1>.

The third delay circuit 322 of the feedback clock generation circuit 32 may delay the first internal clock signal ICLK<1> to generate the second feedback clock signal CLK_FD<2> having a logic "high" level.

At a point of time "T3", the frequency division circuit 10 may divide a frequency of the clock signal CLK and the complementary clock signal CLKB, which are provided by an external device, to generate the second division clock signal DCLK<2>.

The second latch 312 of the latch circuit 31 may latch the second division clock signal DCLK<2> in response to the second feedback clock signal CLK_FD<2> having a logic "high" level and may output the latched second division clock signal DCLK<2> as the second internal clock signal ICLK<2>.

The second latch 312 of the latch circuit 31 may generate the second internal clock signal ICLK<2> having a logic "low" level even though the second division clock signal DCLK<2> is generated to have a logic "high" level, if the second feedback clock signal CLK_FD<2> generated from the first internal clock signal ICLK<1> is not generated. That is, the second latch 312 of the latch circuit 31 may generate the second internal clock signal ICLK<2> after the first internal clock signal ICLK<1> is generated.

The first alignment circuit 41 may drive the first output datum DOUT<1> in response to the first input datum DIN<1> since the first and second internal clock signals ICLK<1:2> are generated.

At a point of time "T4", the fourth delay circuit 323 of the feedback clock generation circuit 32 may delay the second internal clock signal ICLK<2> to generate the third feedback clock signal CLK_FD<3> having a logic "high" level.

At a point of time "T5", the frequency division circuit 10 may divide a frequency of the clock signal CLK and the complementary clock signal CLKB, which are provided by an external device, to generate the third division clock signal DCLK<3>.

The third latch 313 of the latch circuit 31 may latch the third division clock signal DCLK<3> in response to the third feedback clock signal CLK_FD<3> having a logic "high" level and may output the latched third division clock signal DCLK<3> as the third internal clock signal ICLK<3>.

The third latch 313 of the latch circuit 31 may generate the third internal clock signal ICLK<3> having a logic "low" level even though the third division clock signal DCLK<3> is generated to have a logic "high" level, if the third feedback clock signal CLK_FD<3> generated from the second internal clock signal ICLK<2> is not generated. That is, the third latch 313 of the latch circuit 31 may generate the third internal clock signal ICLK<3> after the second internal clock signal ICLK<2> is generated.

The second alignment circuit 42 may drive the second output datum DOUT<2> in response to the second input datum DIN<2> since the second and third internal clock signals ICLK<2:3> are generated.

At a point of time "T6", the fifth delay circuit 324 of the feedback clock generation circuit 32 may delay the third internal clock signal ICLK<3> to generate the fourth feedback clock signal CLK_FD<4> having a logic "high" level.

At a point time "T7", the frequency division circuit 10 may divide a frequency of the clock signal CLK and the complementary clock signal CLKB, which are provided by an external device, to generate the fourth division clock signal DCLK<4>.

The fourth latch 314 of the latch circuit 31 may latch the fourth division clock signal DCLK<4> in response to the fourth feedback clock signal CLK_FD<4> having a logic "high" level and may output the latched fourth division clock signal DCLK<4> as the fourth internal clock signal ICLK<4>.

The fourth latch 314 of the latch circuit 31 may generate the fourth internal clock signal ICLK<4> having a logic "low" level even though the fourth division clock signal DCLK<4> is generated to have a logic "high" level, if the fourth feedback clock signal CLK_FD<4> generated from the third internal clock signal ICLK<3> is not generated. That is, the fourth latch 314 of the latch circuit 31 may generate the fourth internal clock signal ICLK<4> after the third internal clock signal ICLK<3> is generated.

The third alignment circuit 43 may drive the third output datum DOUT<3> in response to the third input datum DIN<3> since the third and fourth internal clock signals ICLK<3:4> are generated.

At a point of time "T8", the sixth delay circuit 325 of the feedback clock generation circuit 32 may delay the fourth internal clock signal ICLK<4> to generate the delay signal DLY having a logic "high" level.

At a point of time "T9", the frequency division circuit 10 may divide a frequency of the clock signal CLK and the complementary clock signal CLKB, which are provided by an external device, to generate the first division clock signal DCLK<1>.

The third logic circuit 321 of the feedback clock generation circuit 32 may delay the delay signal DLY to generate the first feedback clock signal CLK_FD<1> having a logic "high" level, in response to the enablement signal EN having a logic "low" level and the period signal CHOP having a logic "high" level.

The first latch 311 of the latch circuit 31 may latch the first division clock signal DCLK<1> in response to the first feedback clock signal CLK_FD<1> having a logic "high" level and may output the latched first division clock signal DCLK<1> as the first internal clock signal ICLK<1>.

The first latch 311 of the latch circuit 31 may generate the first internal clock signal ICLK<1> having a logic "low" level even though the first division clock signal DCLK<1> is generated to have a logic "high" level, if the first feedback clock signal CLK_FD<1> generated from the fourth internal clock signal ICLK<4> is not generated. That is, the first latch 311 of the latch circuit 31 may generate the first internal clock signal ICLK<1> after the fourth internal clock signal ICLK<4> is generated.

The fourth alignment circuit 44 may drive the fourth output datum DOUT<4> in response to the fourth input datum DIN<4> since the first and fourth internal clock signals ICLK<1> and ICLK<4> are generated.

Operations of the semiconductor device for outputting the first to fourth input data DIN<1:4> as the first to fourth output data DOUT<1:4> in synchronization with the first to fourth internal clock signals ICLK<1:4> after the point of time "T9" may be the same as the operation described with reference to FIG. 8. Thus, the operations performed in the semiconductor device after the point of time "T9" will be omitted hereinafter.

As described above, a semiconductor device according to an embodiment may sequentially generate a plurality of internal clock signals by dividing a frequency of a clock signal to clearly obtain a phase difference between the plurality of internal clock signals for serializing output data. As a result, it may be possible to obtain a sufficient valid window of the output data.

Figure 9:
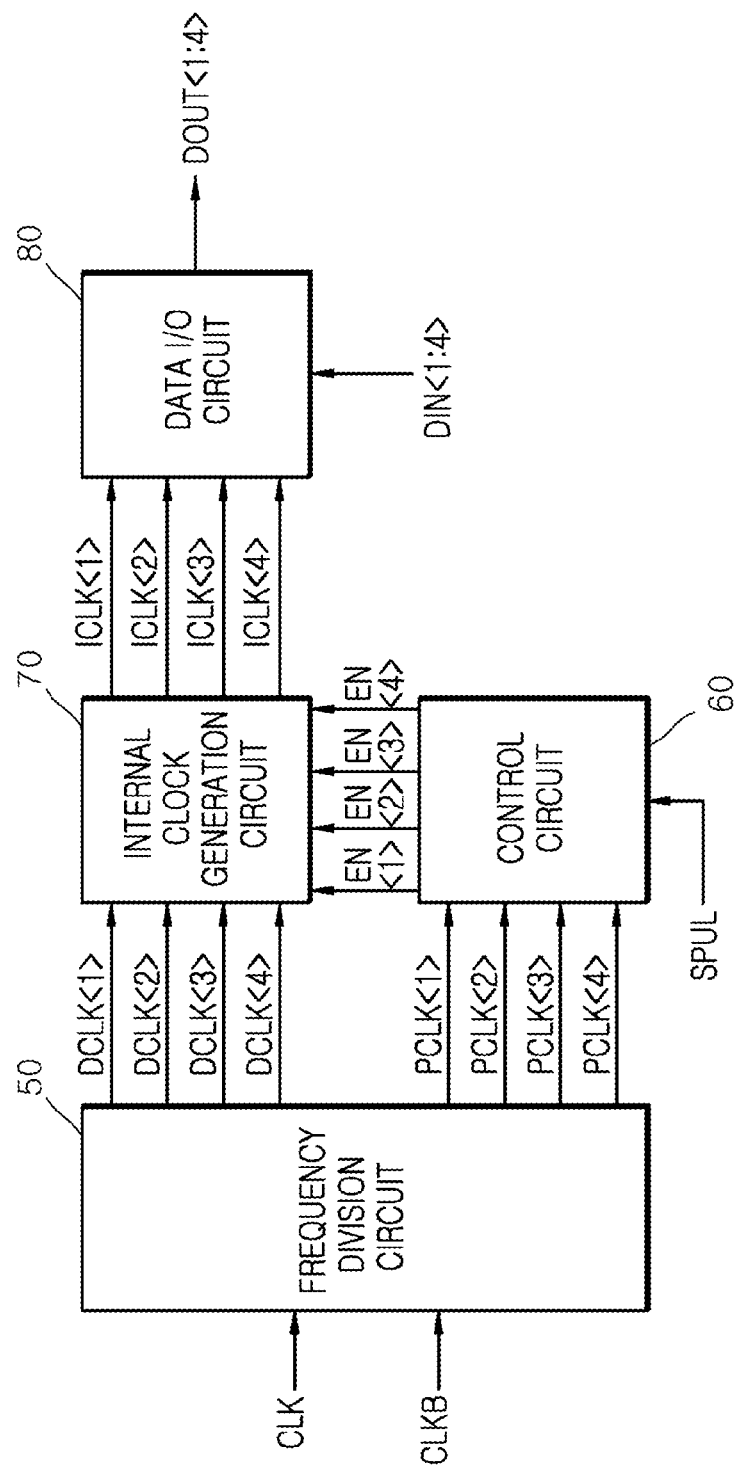
FIG. 9 is a block diagram illustrating a configuration of a semiconductor device according to another embodiment of the present disclosure.

Referring to FIG. 9, a semiconductor device according to an embodiment may include a frequency division circuit 50, a control circuit 60, an internal clock generation circuit 70 and a data I/O circuit 80.

The frequency division circuit 50 may divide a frequency of a clock signal CLK and a complementary clock signal CLKB, which are provided by an external device, to generate first to fourth pre-clock signals PCLK<1:4> which are periodically toggled. The frequency division circuit 50 may also divide a frequency of the clock signal CLK and the complementary clock signal CLKB, which are provided by an external device, to generate first to fourth division clock signals DCLK<1:4>. The clock signal CLK may be a signal that is periodically toggled. The clock signal CLK may be provided to synchronize an operation of the semiconductor device. The complementary clock signal CLKB may be an inverted signal of the clock signal CLK. The first to fourth pre-clock signals PCLK<1:4> may be generated by dividing a frequency of the clock signal CLK and the complementary clock signal CLKB to have a phase difference of 90 degrees therebetween. The first to fourth division clock signals DCLK<1:4> may also be generated by dividing a frequency of the clock signal CLK and the complementary clock signal CLKB to have a phase difference of 90 degrees therebetween. The frequency division circuit 50 may be realized using a general frequency division circuit including a phase locked loop (PLL) circuit and a delay locked loop (DLL) circuit. Although FIG. 9 illustrates an example in which the frequency division circuit 50 generates the first to fourth pre-clock signals PCLK<1:4> and the first to fourth division clock signals DCLK<1:4> in response to the clock signal CLK, the present disclosure is not limited thereto. For example, the number of the pre-clock signals and the number of the division clock signals generated by the frequency division circuit 50 may be set to be different according to the embodiments.

The control circuit 60 may generate first to fourth enablement signals EN<1:4> which are set to have an enablement period corresponding to a multiple of a cycle of the first to fourth pre-clock signals PCLK<1:4>. The control circuit 60 may generate the first enablement signal EN<1> which is enabled in response to a pulse signal SPUL and which is set to have an enablement period corresponding to a multiple of a cycle of the third pre-clock signal PCLK<3>. The control circuit 60 may generate the second enablement signal EN<2> which is enabled in response to the pulse signal SPUL and which is set to have an enablement period corresponding to a multiple of a cycle of the fourth pre-clock signal PCLK<4>. The control circuit 60 may generate the third enablement signal EN<3> which is enabled in response to the pulse signal SPUL and which is set to have an enablement period corresponding to a multiple of a cycle of the first pre-clock signal PCLK<1>. The control circuit 60 may generate the fourth enablement signal EN<4> which is enabled in response to the pulse signal SPUL and which is set to have an enablement period corresponding to a multiple of a cycle of the second pre-clock signal PCLK<2>. The first to fourth enablement signals EN<1:4> may be set to be sequentially enabled. The pulse signal SPUL may be enabled during a write operation for storing first to fourth output data DOUT<1:4> into a memory cell area (not illustrated) and during a read operation for outputting the first to fourth output data DOUT<1:4> stored in the memory cell area.

The internal clock generation circuit 70 may generate first to fourth internal clock signals ICLK<1:4> from the first to fourth division clock signals DCLK<1:4> in response to the first to fourth enablement signals EN<1:4>. The internal clock generation circuit 70 may generate the first internal clock signal ICLK<1> from the first division clock signal DCLK<1> in a time period that the first enablement signal EN<1> is enabled. The internal clock generation circuit 70 may generate the second internal clock signal ICLK<2> from the second division clock signal DCLK<2> in a time period that the second enablement signal EN<2> is enabled. The internal clock generation circuit 70 may generate the third internal clock signal ICLK<3> from the third division clock signal DCLK<3> in a time period that the third enablement signal EN<3> is enabled. The internal clock generation circuit 70 may generate the fourth internal clock signal ICLK<4> from the fourth division clock signal DCLK<4> in a time period that the fourth enablement signal EN<4> is enabled.

The data I/O circuit 80 may be synchronized with the first to fourth internal clock signals ICLK<1:4> to output first to fourth input data DIN<1:4> as the first to fourth output data DOUT<1:4>. The data I/O circuit 80 may align the first to fourth input data DIN<1:4> in synchronization with the first to fourth internal clock signals ICLK<1:4> and may output the aligned first to fourth input data DIN<1:4> as the first to fourth output data DOUT<1:4>. Although the present embodiment illustrates an example in which the number of bits included in the first to fourth output data DOUT<1:4> is four, the number of bits included in the output data may be set to be different according to the embodiments. The data I/O circuit 80 may be realized to have substantially the same configuration as the data I/O circuit 40 described with reference to FIG. 5.

Figure 10:
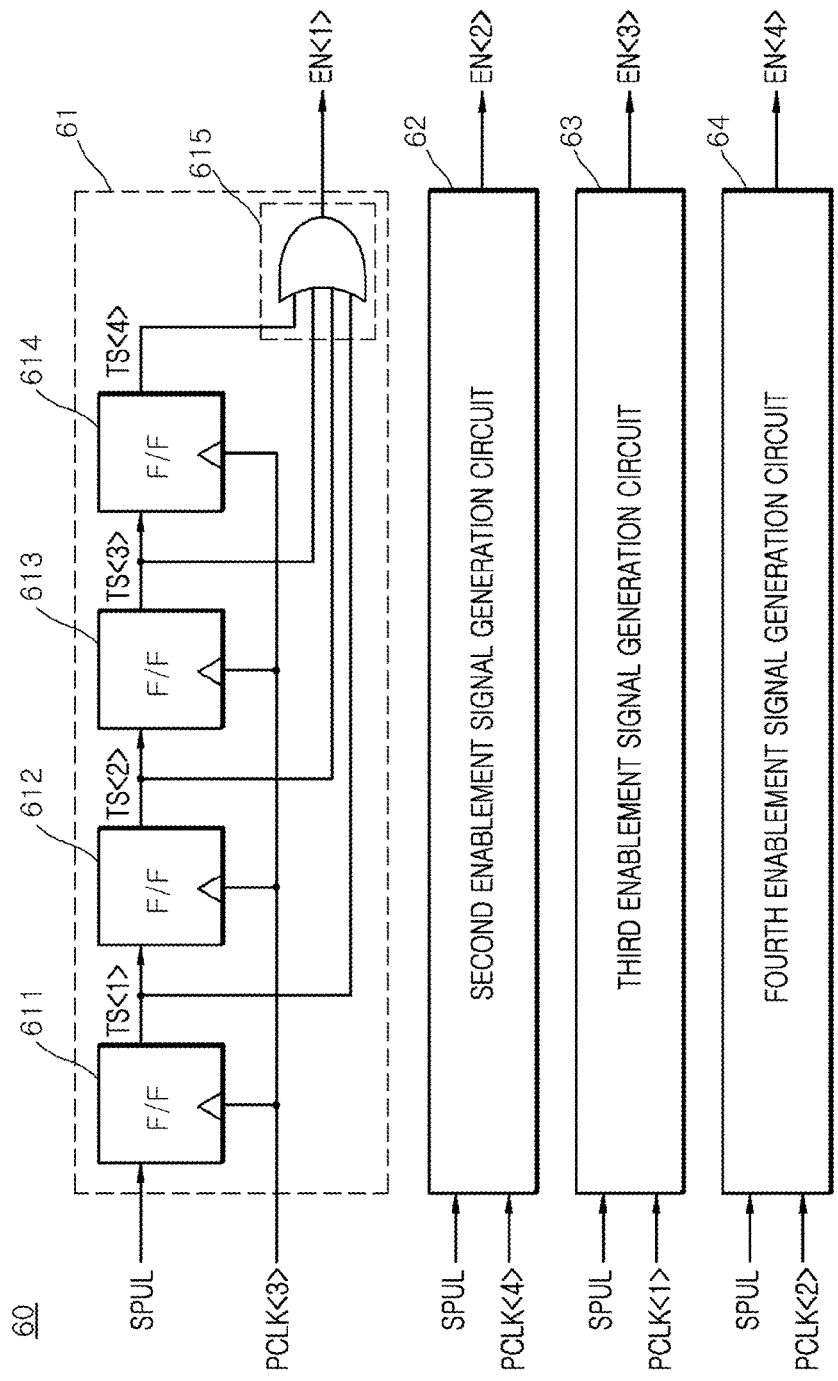
FIG. 10 illustrates a configuration of a control circuit included in the semiconductor device of FIG. 9.

Referring to FIG. 10, the control circuit 60 may include a first enablement signal generation circuit 61, a second enablement signal generation circuit 62, a third enablement signal generation circuit 63 and a fourth enablement signal generation circuit 64.

The first enablement signal generation circuit 61 may include a first flip-flop 611, a second flip-flop 612, a third flip-flop 613, a fourth flip-flop 614 and a logic circuit 615.

The first flip-flop 611 may be synchronized with the third pre-clock signal PCLK<3> to output the pulse signal SPUL as a first transmission signal TS<1>. The first flip-flop 611 may be synchronized with a rising edge of the third pre-clock signal PCLK<3> to generate the first transmission signal TS<1> having a logic "high" level if the pulse signal SPUL inputted to the first flip-flop 611 has a logic "high" level.

The second flip-flop 612 may be synchronized with the third pre-clock signal PCLK<3> to output the first transmission signal TS<1> as a second transmission signal TS<2>. The second flip-flop 612 may be synchronized with a rising edge of the third pre-clock signal PCLK<3> to generate the second transmission signal TS<2> having a logic "high" level if the first transmission signal TS<1> inputted to the second flip-flop 612 has a logic "high" level.

The third flip-flop 613 may be synchronized with the third pre-clock signal PCLK<3> to output the second transmission signal TS<2> as a third transmission signal TS<3>. The third flip-flop 613 may be synchronized with a rising edge of the third pre-clock signal PCLK<3> to generate the third transmission signal TS<3> having a logic "high" level if the second transmission signal TS<2> inputted to the third flip-flop 613 has a logic "high" level.

The fourth flip-flop 614 may be synchronized with the third pre-clock signal PCLK<3> to output the third transmission signal TS<3> as a fourth transmission signal TS<4>. The fourth flip-flop 614 may be synchronized with a rising edge of the third pre-clock signal PCLK<3> to generate the fourth transmission signal TS<4> having a logic "high" level if the third transmission signal TS<3> inputted to the fourth flip-flop 614 has a logic "high" level.

The logic circuit 615 may perform a logical OR operation of the first to fourth transmission signals TS<1:4> to generate the first enablement signal EN<1>. The logic circuit 615 may generate the first enablement signal EN<1> which is enabled to have a logic "high" level if at least one of the first to fourth transmission signals TS<1:4> is generated to have a logic "high" level. In an embodiment, for example, the logic circuit 615 may include an OR gate or an equivalent circuit to implement the OR operation.

As described above, the first enablement signal generation circuit 61 may generate the first enablement signal EN<1> which is enabled in response to the pulse signal SPUL and which is set to have an enablement period corresponding to a multiple of a cycle of the third pre-clock signal PCLK<3>. The first enablement signal generation circuit 61 may generate the first enablement signal EN<1> which is enabled to have a logic "high" level if the pulse signal SPUL is inputted and which is disabled to have a logic "low" level if all of the first to fourth transmission signals TS<1:4> are generated to have a logic "low" level.

Each of the second to fourth enablement signal generation circuits 62, 63 and 64 may be realized using the same circuit as the first enablement signal generation circuit 61 except input and output signals thereof. Thus, detailed descriptions of the second to fourth enablement signal generation circuits 62, 63 and 64 will be omitted hereinafter.

Figure 11:
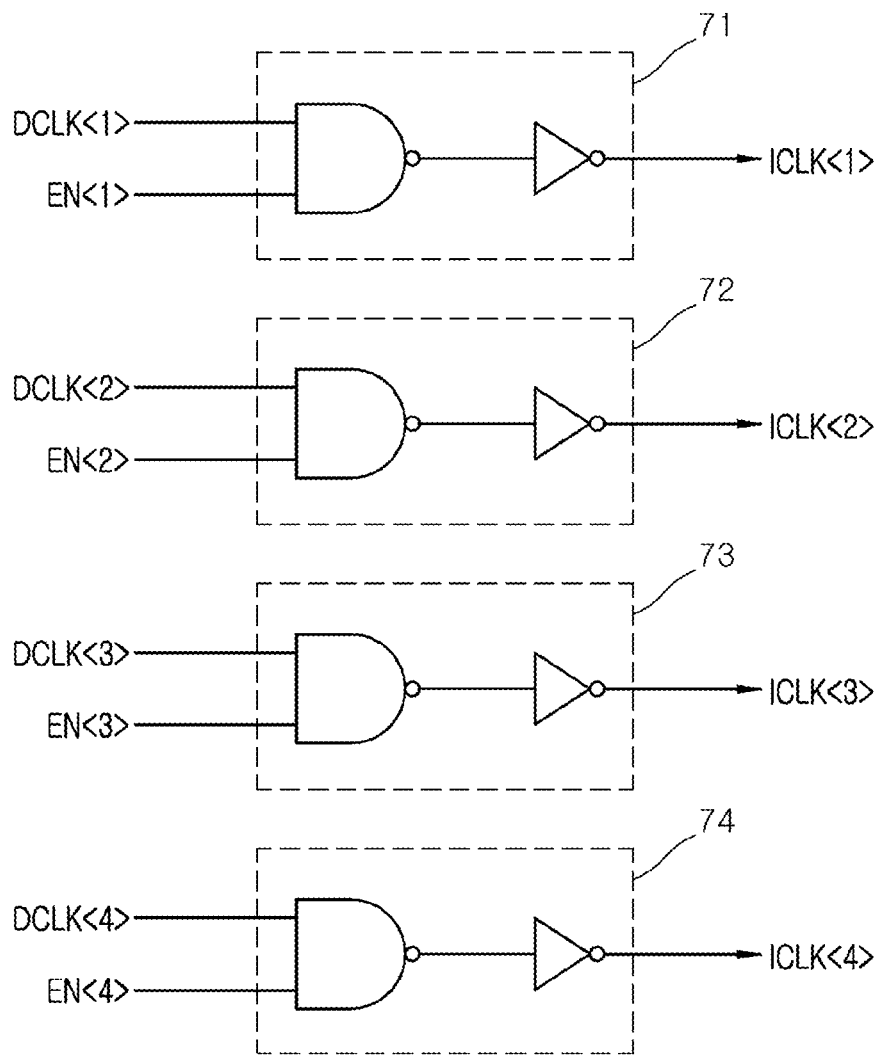
FIG. 11 is a circuit diagram illustrating a configuration of an internal clock generation circuit included in the semiconductor device of FIG. 9.

Referring to FIG. 11, the internal clock generation circuit 70 may include a first internal clock generation circuit 71, a second internal clock generation circuit 72, a third internal clock generation circuit 73 and a fourth internal clock generation circuit 74.

The first internal clock generation circuit 71 may buffer the first division clock signal DCLK<1> to generate the first internal clock signal ICLK<1>, in response to the first enablement signal EN<1>. The first internal clock generation circuit 71 may buffer the first division clock signal DCLK<1> to generate the first internal clock signal ICLK<1> in a time period that the first enablement signal EN<1> is enabled to have a logic "high" level. In an embodiment, for example, a NAND operation may be performed with the first division clock signal DCLK<1> and the first enablement signal EN<1> and then an inversion and buffering operation may be performed on the resultant signal to generate the first internal clock signal ICLK<1>. In an embodiment, for example, the first internal clock generation circuit 71 may include a NAND gate and an inverting buffer to perform the NAND, inversion, and buffering operations, or may include equivalent circuits to perform the NAND, inversion, and buffering operations.

The second internal clock generation circuit 72 may buffer the second division clock signal DCLK<2> to generate the second internal clock signal ICLK<2>, in response to the second enablement signal EN<2>. The second internal clock generation circuit 72 may buffer the second division clock signal DCLK<2> to generate the second internal clock signal ICLK<2> in a time period that the second enablement signal EN<2> is enabled to have a logic "high" level. In an embodiment, for example, a NAND operation may be performed with the second division clock signal DCLK<2> and the second enablement signal EN<2> and then an inversion and buffering operation may be performed on the resultant signal to generate the second internal clock signal ICLK<2>. In an embodiment, for example, the second internal clock generation circuit 72 may include a NAND gate and inverting buffer to perform the NAND, inversion, and buffering operations, or may include equivalent circuits to perform the NAND, inversion, and buffering operations.

The third internal clock generation circuit 73 may buffer the third division clock signal DCLK<3> to generate the third internal clock signal ICLK<3>, in response to the third enablement signal EN<3>. The third internal clock generation circuit 73 may buffer the third division clock signal DCLK<3> to generate the third internal clock signal ICLK<3> in a time period that the third enablement signal EN<3> is enabled to have a logic "high" level. In an embodiment, for example, a NAND operation may be performed with the third division clock signal DCLK<3> and the third enablement signal EN<3> and then an inversion and buffering operation may be performed on the resultant signal to generate the third internal clock signal ICLK<3>. In an embodiment, for example, the third internal clock generation circuit 73 may include a NAND gate and an inverting buffer to perform the NAND, inversion, and buffering operations, or may include equivalent circuits to perform the NAND, inversion, and buffering operations.

The fourth internal clock generation circuit 74 may buffer the fourth division clock signal DCLK<4> to generate the fourth internal clock signal ICLK<4>, in response to the fourth enablement signal EN<4>. The fourth internal clock generation circuit 74 may buffer the fourth division clock signal DCLK<4> to generate the fourth internal clock signal ICLK<4> in a time period that the fourth enablement signal EN<4> is enabled to have a logic "high" level. In an embodiment, for example, a NAND operation may be performed with the fourth division clock signal DCLK<4> and the fourth enablement signal EN<4> and then an inversion and buffering operation may be performed on the resultant signal to generate the fourth internal clock signal ICLK<4>. In an embodiment, for example, the fourth internal clock generation circuit 74 may include a NAND gate and an inverting buffer to perform the NAND, inversion, and buffering operations, or may include equivalent circuits to perform the NAND, inversion, and buffering operations.

Figure 12:
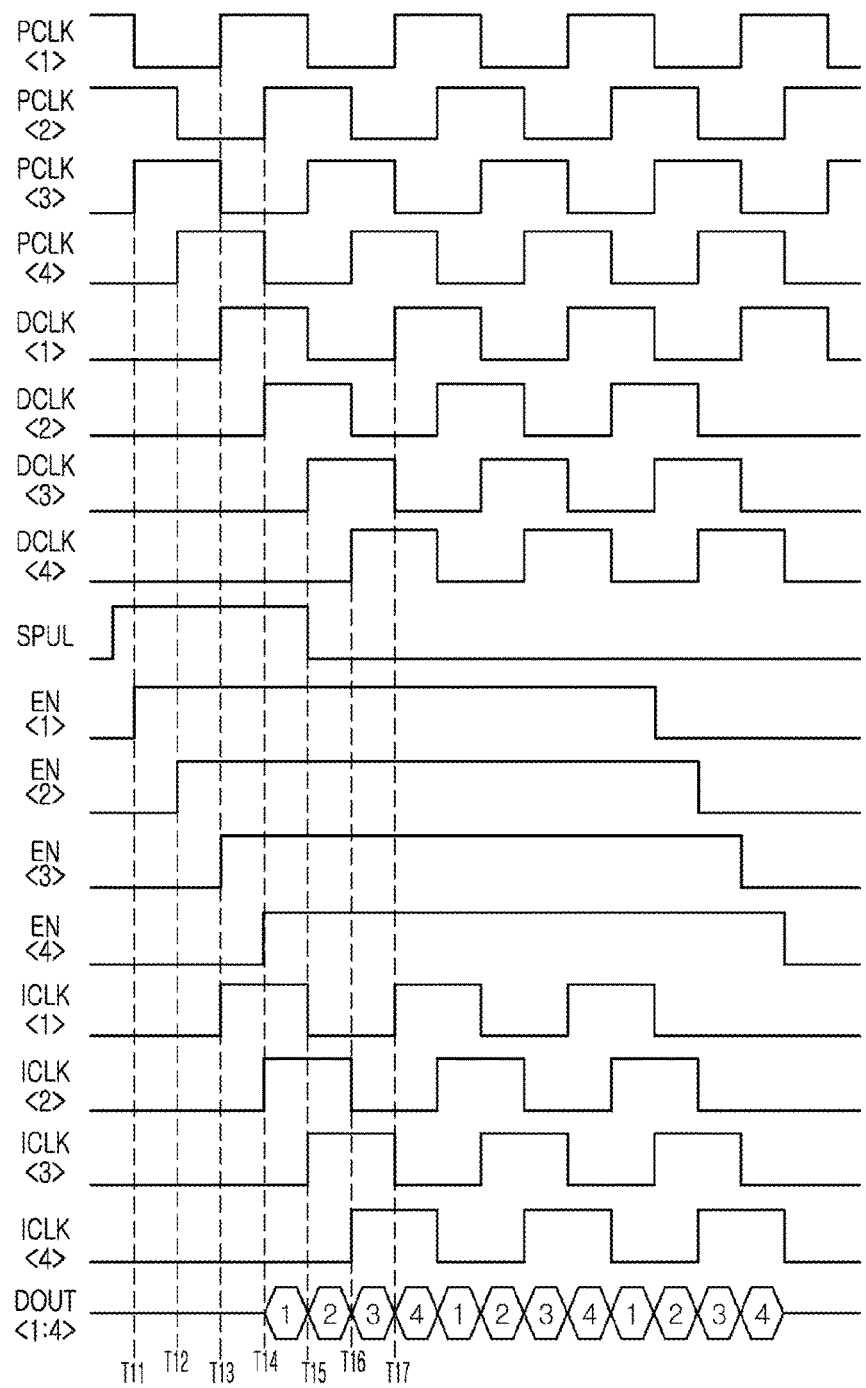
FIG. 12 is a timing diagram illustrating an operation of a semiconductor device according to another embodiment of the present disclosure.

An operation of the semiconductor device illustrated in FIG. 9 will be described hereinafter with reference to FIG. 12. In particular, an operation of the semiconductor device for outputting the first to fourth input data DIN<1:4> as the first to fourth output data DOUT<1:4> in synchronization with the first to fourth internal clock signals ICLK<1:4> will be described hereinafter.

First, before a point of time "T11", the frequency division circuit 50 may divide a frequency of the clock signals CLK and the complementary clock signal CLKB, which are provided by an external device, to generate the first to fourth pre-clock signals PCLK<1:4> which are periodically toggled.

At the point of time "T11", the first enablement signal generation circuit 61 may generate the first enablement signal EN<1> in synchronization with the third pre-clock signal PCLK<3>, and the first enablement signal EN<1>, in synchronization with the third pre-clock signal PCLK<3>, may be enabled to have a logic "high" level in response to the pulse signal SPUL.

At a point of time "T12", the second enablement signal generation circuit 62 may generate the second enablement signal EN<2> in synchronization with the fourth pre-clock signal PCLK<4>, and the second enablement signal EN<2>, in synchronization with the fourth pre-clock signal PCLK<4>, may be enabled to have a logic "high" level in response to the pulse signal SPUL.

At a point of time "T13", the third enablement signal generation circuit 63 may generate the third enablement signal EN<3> in synchronization with the first pre-clock signal PCLK<1>, and the third enablement signal EN<3>, in synchronization with the first pre-clock signal PCLK<1>, may be enabled to have a logic "high" level in response to the pulse signal SPUL.

The frequency division circuit 50 may divide a frequency of the clock signal CLK and the complementary clock signal CLKB, which are provided by an external device, to generate the first division clock signal DCLK<1>.

The first internal clock generation circuit 71 may buffer the first division clock signal DCLK<1> to generate the first internal clock signal ICLK<1>, in response to the first enablement signal EN<1> having a logic "high" level.

At a point of time "T14", the fourth enablement signal generation circuit 64 may generate the fourth enablement signal EN<4> in synchronization with the second pre-clock signal PCLK<2>, and the fourth enablement signal EN<4>, in synchronization with the second pre-clock signal PCLK<2>, may be enabled to have a logic "high" level in response to the pulse signal SPUL.

The frequency division circuit 50 may divide a frequency of the clock signal CLK and the complementary clock signal CLKB, which are provided by an external device, to generate the second division clock signals DCLK<2>.

The second internal clock generation circuit 72 may buffer the second division clock signal DCLK<2> to generate the second internal clock signal ICLK<2>, in response to the second enablement signal EN<2> having a logic "high" level.

A first alignment circuit (not illustrated) of the data I/O circuit 80 may drive the first output datum DOUT<1> in response to the first input datum DIN<1> since the first and second internal clock signals ICLK<1:2> are generated.

At a point of time "T15", the frequency division circuit 50 may divide a frequency of the clock signal CLK and the complementary clock signal CLKB, which are provided by an external device, to generate the third division clock signals DCLK<3>.

The third internal clock generation circuit 73 may buffer the third division clock signal DCLK<3> to generate the third internal clock signal ICLK<3>, in response to the third enablement signal EN<3> having a logic "high" level.

A second alignment circuit (not illustrated) of the data I/O circuit 80 may drive the second output datum DOUT<2> in response to the second input datum DIN<2> since the second and third internal clock signals ICLK<2:3> are generated.

At a point of time "T16", the frequency division circuit 50 may divide a frequency of the clock signal CLK and the complementary clock signal CLKB, which are provided by an external device, to generate the fourth division clock signals DCLK<4>.

The fourth internal clock generation circuit 74 may buffer the fourth division clock signal DCLK<4> to generate the fourth internal clock signal ICLK<4>, in response to the fourth enablement signal EN<4> having a logic "high" level.

A third alignment circuit (not illustrated) of the data I/O circuit 80 may drive the third output datum DOUT<3> in response to the third input datum DIN<3> since the third and fourth internal clock signals ICLK<3:4> are generated.

At a point of time "T17", the frequency division circuit 50 may divide a frequency of the clock signal CLK and the complementary clock signal CLKB, which are provided by an external device, to generate the first division clock signals DCLK<1>.

The first internal clock generation circuit 71 may buffer the first division clock signal DCLK<1> to generate the first internal clock signal ICLK<1>, in response to the first enablement signal EN<1> having a logic "high" level.

A fourth alignment circuit (not illustrated) of the data I/O circuit 80 may drive the fourth output datum DOUT<4> in response to the fourth input datum DIN<4> since the first and fourth internal clock signals ICLK<1> and ICLK<4> are generated.

Operations of the semiconductor device for outputting the first to fourth input data DIN<1:4> as the first to fourth output data DOUT<1:4> in synchronization with the first to fourth internal clock signals ICLK<1:4> after the point of time "T17" may be the same as the operation described with reference to FIG. 12. Thus, the operations performed in the semiconductor device after the point of time "T17" will be omitted hereinafter.

As described above, a semiconductor device according to another embodiment may divide a frequency of a clock signal to generate an internal clock signal only during an enablement period of an enablement signal. Thus, the internal clock signal may be stably generated.

What is claimed is:

1. A semiconductor device comprising:
   an internal clock generation circuit configured to generate first to fourth internal clock signals from first to fourth division clock signals; and
   a data input and output (I/O) circuit configured to output input data as output data in synchronization with the first to fourth internal clock signals,
   wherein the first internal clock signal is generated after the fourth internal clock signal is generated, the second internal clock signal is generated after the first internal clock signal is generated, the third internal clock signal is generated after the second internal clock signal is generated, and the fourth internal clock signal is generated after the third internal clock signal is generated.

2. The semiconductor device of claim 1,
   wherein the first to fourth division clock signals are generated by dividing a frequency of a clock signal provided externally from the semiconductor device; and
   wherein the first to fourth division clock signals are generated to have different phases.

3. The semiconductor device of claim 1, wherein the internal clock generation circuit includes:
   a latch circuit configured to latch the first to fourth division clock signals to output the latched first to fourth division clock signals as the first to fourth internal clock signals, in response to first to fourth feedback clock signals; and
   a feedback clock generation circuit configured to delay the first to fourth internal clock signals to generate the first to fourth feedback clock signals.

4. The semiconductor device of claim 3, wherein the latch circuit includes:
   a first latch configured to latch the first division clock signal to output the latched first division clock signal as the first internal clock signal if the first feedback clock signal has a second logic level, configured to interrupt the input of the first division clock signal if the first feedback clock signal has a first logic level, and configured to output the first internal clock signal having the first logic level if the first division clock signal has the first logic level;
   a second latch configured to latch the second division clock signal to output the latched second division clock signal as the second internal clock signal if the second feedback clock signal has the second logic level, configured to interrupt the input of the second division clock signal if the second feedback clock signal has the first logic level, and configured to output the second internal clock signal having the first logic level if the second division clock signal has the first logic level;
   a third latch configured to latch the third division clock signal to output the latched third division clock signal as the third internal clock signal if the third feedback clock signal has the second logic level, configured to interrupt the input of the third division clock signal if the third feedback clock signal has the first logic level, and configured to output the third internal clock signal having the first logic level if the third division clock signal has the first logic level; and
   a fourth latch configured to latch the fourth division clock signal to output the latched fourth division clock signal as the fourth internal clock signal if the fourth feedback clock signal has the second logic level, configured to interrupt the input of the fourth division clock signal if the fourth feedback clock signal has the first logic level, and configured to output the fourth internal clock signal having the first logic level if the fourth division clock signal has the first logic level.

5. The semiconductor device of claim 3, wherein the feedback clock generation circuit includes:
   a logic circuit configured to delay a delay signal to output the delayed delay signal as the first feedback clock signal, in response to an enablement signal and a period signal;
   a first delay circuit configured to delay the first internal clock signal to output the delayed first internal clock signal as the second feedback clock signal;
   a second delay circuit configured to delay the second internal clock signal to output the delayed second internal clock signal as the third feedback clock signal;
   a third delay circuit configured to delay the third internal clock signal to output the delayed third internal clock signal as the fourth feedback clock signal; and
   a fourth delay circuit configured to delay the fourth internal clock signal to output the delayed fourth internal clock signal as the delay signal.

6. The semiconductor device of claim 5, further comprising a control circuit configured to be synchronized with the first division clock signal and the third division clock signal to generate the enablement signal and the period signal which are enabled in response to a pulse signal that is enabled during a write operation and a read operation for storing and outputting the output data.

7. The semiconductor device of claim 6, wherein the control circuit includes:
   an enablement signal generation circuit configured to generate the enablement signal which is enabled in response to the pulse signal and which is set to have an enablement period corresponding to a multiple of a cycle of the first division clock signal; and
   a period signal generation circuit configured to generate the period signal which is enabled in response to the pulse signal and which is set to have an enablement period corresponding to a multiple of a cycle of the third division clock signal.

8. The semiconductor device of claim 1,
   wherein the input data includes first to fourth input data;
   wherein the output data includes first to fourth output data; and
   wherein the data I/O circuit is synchronized with the first internal clock signal to output the first input datum as the first output datum, is synchronized with the second internal clock signal to output the second input datum as the second output datum, is synchronized with the third internal clock signal to output the third input datum as the third output datum, and is synchronized with the fourth internal clock signal to output the fourth input datum as the fourth output datum.

9. The semiconductor device of claim 1,
   wherein the input data includes first to fourth input data;
   wherein the output data includes first to fourth output data; and
   wherein the data I/O circuit includes:
   a first alignment circuit configured to perform a precharge operation if at least one of the first and second internal clock signals is not generated and configured to drive the first output datum in response to the first input datum if the first and second internal clock signals are generated;

a second alignment circuit configured to perform a precharge operation if at least one of the second and third internal clock signals is not generated and configured to drive the second output datum in response to the second input datum if the second and third internal clock signals are generated;

a third alignment circuit configured to perform a precharge operation if at least one of the third and fourth internal clock signals is not generated and configured to drive the third output datum in response to the third input datum if the third and fourth internal clock signals are generated; and a fourth alignment circuit configured to perform a precharge operation if at least one of the first and fourth internal clock signals is not generated and configured to drive the fourth output datum in response to the fourth input datum if the first and fourth internal clock signals are generated.

10. The semiconductor device of claim 1, further comprising a frequency division circuit configured to divide a frequency of a clock signal provided by an external device to generate the first to fourth division clock signals.

11. The semiconductor device of claim 10, wherein the frequency division circuit includes:
a fifth delay circuit configured to inversely buffer the first division clock signal to generate a first delay signal and configured to inversely buffer the first delay signal to generate a second delay signal;
a sixth delay circuit configured to inversely buffer the second division clock signal to generate a third delay signal and configured to inversely buffer the third delay signal to generate a fourth delay signal;
a first division clock generation circuit configured to be synchronized with the clock signal to output the first delay signal as the first division clock signal;
a second division clock generation circuit configured to be synchronized with an inverted signal of the clock signal to output the third delay signal as the second division clock signal;
a third division clock generation circuit configured to be synchronized with the clock signal to output the second delay signal as the third division clock signal; and
a fourth division clock generation circuit configured to be synchronized with the inverted signal of the clock signal to output the fourth delay signal as the fourth division clock signal.

12. A semiconductor device comprising:
a control circuit configured to generate first to fourth enablement signals which are set to have an enablement period corresponding to a multiple of a cycle of first to fourth pre-clock signals based on a pulse signal;
an internal clock generation circuit configured to generate first to fourth internal clock signals from first to fourth division clock signals based on the first to fourth enablement signals; and
a data input and output (I/O) circuit configured to output input data as output data in synchronization with the first to fourth internal clock signals,
wherein the first internal clock signal is generated during the enablement period of the first enablement signal, the second internal clock signal is generated during the enablement period of the second enablement signal, the third internal clock signal is generated during the enablement period of the third enablement signal, and the fourth internal clock signal is generated during the enablement period of the fourth enablement signal.

13. The semiconductor device of claim 12, wherein the pulse signal is enabled during a write operation and a read operation for storing and outputting the output data.

14. The semiconductor device of claim 12,
wherein the first to fourth pre-clock signals are generated by dividing a frequency of a clock signal provided externally from the semiconductor device; and
wherein the first to fourth pre-clock signals are periodically toggled to have different phases.

15. The semiconductor device of claim 12,
wherein the first to fourth division clock signals are generated by dividing a frequency of a clock signal provided externally from the semiconductor device; and
wherein the first to fourth division clock signals are generated to have different phases.

16. The semiconductor device of claim 12, wherein the first to fourth enablement signals are sequentially enabled.

17. The semiconductor device of claim 12, wherein the control circuit includes:
a first enablement signal generation circuit configured to generate the first enablement signal which is enabled in response to the pulse signal and which is set to have an enablement period corresponding to a multiple of a cycle of the third pre-clock signal;
a second enablement signal generation circuit configured to generate the second enablement signal which is enabled in response to the pulse signal and which is set to have an enablement period corresponding to a multiple of a cycle of the fourth pre-clock signal;
a third enablement signal generation circuit configured to generate the third enablement signal which is enabled in response to the pulse signal and which is set to have an enablement period corresponding to a multiple of a cycle of the first pre-clock signal; and
a fourth enablement signal generation circuit configured to generate the fourth enablement signal which is enabled in response to the pulse signal and which is set to have an enablement period corresponding to a multiple of a cycle of the second pre-clock signal.

18. The semiconductor device of claim 12, wherein the internal clock generation circuit includes:
a first internal clock generation circuit configured to buffer the first division clock signal to generate the first internal clock signal, in response to the first enablement signal;
a second internal clock generation circuit configured to buffer the second division clock signal to generate the second internal clock signal, in response to the second enablement signal;
a third internal clock generation circuit configured to buffer the third division clock signal to generate the third internal clock signal, in response to the third enablement signal; and
a fourth internal clock generation circuit configured to buffer the fourth division clock signal to generate the fourth internal clock signal, in response to the fourth enablement signal.

19. The semiconductor device of claim 12,
wherein the input data includes first to fourth input data;
wherein the output data includes first to fourth output data; and
wherein the data I/O circuit is synchronized with the first internal clock signal to output the first input datum as the first output datum, is synchronized with the second internal clock signal to output the second input datum as the second output datum, is synchronized with the third internal clock signal to output the third input datum as the third output datum, and is synchronized with the fourth internal clock signal to output the fourth input datum as the fourth output datum.

20. The semiconductor device of claim 12,
wherein the input data includes first to fourth input data;
wherein the output data includes first to fourth output data; and
wherein the data I/O circuit includes:
a first alignment circuit configured to perform a pre-charge operation if at least one of the first and second internal clock signals is not generated and configured to drive the first output datum in response to the first input datum if the first and second internal clock signals are generated;
a second alignment circuit configured to perform a pre-charge operation if at least one of the second and third internal clock signals is not generated and configured to drive the second output datum in response to the second input datum if the second and third internal clock signals are generated;
a third alignment circuit configured to perform a pre-charge operation if at least one of the third and fourth internal clock signals is not generated and configured to drive the third output datum in response to the third input datum if the third and fourth internal clock signals are generated; and
a fourth alignment circuit configured to perform a pre-charge operation if at least one of the first and fourth internal clock signals is not generated and configured to drive the fourth output datum in response to the fourth input datum if the first and fourth internal clock signals are generated.

* * * * *